(12) United States Patent
Sathe et al.

(10) Patent No.: US 6,840,777 B2
(45) Date of Patent: Jan. 11, 2005

(54) SOLDERLESS ELECTRONICS PACKAGING

(75) Inventors: Ajit V. Sathe, Chandler, AZ (US); Paul H. Wermer, San Francisco, CA (US)

(73) Assignee: Intel Corporation, Santa Clara, CA (US)

(*) Notice: Subject to any disclaimer, the term of this patent is extended or adjusted under 35 U.S.C. 154(b) by 549 days.

(21) Appl. No.: 09/726,629

(22) Filed: Nov. 30, 2000

(65) Prior Publication Data

US 2002/0065965 A1 May 30, 2002

(51) Int. Cl.[7] .............................................. H01R 12/00
(52) U.S. Cl. ............................ 439/65; 439/91; 361/768
(58) Field of Search ............................... 439/65–69, 71, 439/74–75, 90–91, 591; 361/767–769, 774, 760; 174/262, 264–265; 257/737–738, 778, 668, 692, 687, 780, 678, 691, E23.063, E23.078; 710/100; 438/612, 637, 668, 672, 629, 772, 779, 774, 978

(56) References Cited

U.S. PATENT DOCUMENTS

| | | | |
|---|---|---|---|
| 4,268,956 A | * 5/1981 | Parks et al. | 29/869 |
| 4,355,082 A | * 10/1982 | Bischoff et al. | 428/607 |
| 4,574,331 A | * 3/1986 | Smolley | 361/735 |
| 4,581,679 A | * 4/1986 | Smolley | 361/742 |
| 4,731,693 A | * 3/1988 | Berg et al. | 361/719 |
| 4,813,129 A | * 3/1989 | Karnezos | 29/832 |
| 4,924,353 A | * 5/1990 | Patraw | 361/783 |
| 4,926,549 A | 5/1990 | Yoshizawa et al. | 29/876 |
| 4,954,875 A | * 9/1990 | Clements | 257/686 |

(List continued on next page.)

FOREIGN PATENT DOCUMENTS

| | | | | |
|---|---|---|---|---|
| JP | 406231818 A | * | 8/1994 | 439/86 |
| JP | 407296868 A | * | 11/1995 | H01R/11/01 |
| JP | 411074051 A | * | 3/1999 | H01R/23/68 |
| JP | 411329541 A | * | 11/1999 | H01R/11/01 |
| WO | WO 87/04009 | * | 7/1987 | H01L/23/48 |

OTHER PUBLICATIONS

Kuozkowski, "The Electrical Conductivity and Breakdown Phenomena in Polyester Polyer–Quinoline Salt of Tetracyanoquinodimethane Composites", IEEE; pp. 158–162.*
Guarin et al., "Contact Resistance Degradation in Z–Axis Connectors Operated at Burn–In Temperatures", IEEE 1993, pp. 892.*
Guarin et al., "Solderless High–Density Interconnects for Burn–In Applications", IEEE 1992, pp. 263–267.*
Saint–Etienne et al. "Silicon Packaging and RF Solder–free Interconnect for X–band SAR T/R Module", ACM; Alcatel Space Industries. 4 pages.*
Cinch, "CIN::APSE High Speed Interconnect Technology" downloaded from Internet Feb. 2004, 5 pages.*

(List continued on next page.)

*Primary Examiner*—Paul R. Myers
(74) *Attorney, Agent, or Firm*—Schwegman, Lundberg, Woessner & Kluth, P.A.

(57) ABSTRACT

To decrease the thickness, or stack height, of an electronics package, the package includes a solderless compression connector between an integrated circuit (IC) package and a substrate such as a printed circuit board (PCB). In one embodiment, the IC package is mounted on the substrate using a land grid array arrangement. Corresponding lands on the IC package and substrate are coupled using a solderless compression connector. The compression connector includes a plurality of electrically conductive elements, such as compressible button contacts, and an apertured support that aligns the button contacts with corresponding lands on the IC package and substrate. In another embodiment, the connector includes electrically conductive pins embedded in a thin plastic sheet. In a further embodiment, the connector includes a microcrystalline film having electrically conductive crystals. In a further embodiment, the compression connector is used within an IC package to couple an IC to an IC package substrate. Methods of fabrication, as well as application of the package to an electronic assembly, an electronic system, and a data processing system, are also described.

34 Claims, 13 Drawing Sheets

U.S. PATENT DOCUMENTS

| | | | | |
|---|---|---|---|---|
| 5,109,320 A | * | 4/1992 | Bourdelaise et al. | 361/785 |
| 5,237,203 A | * | 8/1993 | Massaron | 257/688 |
| 5,281,771 A | * | 1/1994 | Swift et al. | 174/262 |
| 5,298,686 A | * | 3/1994 | Bourdelaise et al. | 174/254 |
| 5,329,423 A | * | 7/1994 | Scholz | 361/760 |
| 5,334,029 A | * | 8/1994 | Akkapeddi et al. | 439/66 |
| 5,434,452 A | * | 7/1995 | Higgins, III | 257/773 |
| 5,440,454 A | * | 8/1995 | Hashimoto et al. | 361/790 |
| 5,444,301 A | * | 8/1995 | Song et al. | 257/737 |
| 5,485,351 A | * | 1/1996 | Hopfer et al. | 361/704 |
| 5,701,233 A | * | 12/1997 | Carson et al. | 361/735 |
| 5,822,197 A | | 10/1998 | Thuault | 361/803 |
| 5,860,818 A | * | 1/1999 | Sakaki et al. | 439/91 |
| 5,886,413 A | * | 3/1999 | Knott et al. | 257/778 |
| 5,886,535 A | * | 3/1999 | Budnaitis | 324/760 |
| 5,911,583 A | * | 6/1999 | Roybal et al. | 439/66 |
| 5,949,654 A | | 9/1999 | Fukuoka | 361/760 |
| 5,953,214 A | * | 9/1999 | Dranchak et al. | 361/767 |
| 5,958,590 A | * | 9/1999 | Kang et al. | 428/403 |
| 6,064,573 A | * | 5/2000 | Morton | 361/704 |
| 6,078,500 A | * | 6/2000 | Beaman et al. | 361/704 |
| 6,225,143 B1 | * | 5/2001 | Rao et al. | 438/106 |
| 6,229,209 B1 | * | 5/2001 | Nakamura et al. | 257/737 |
| 6,247,938 B1 | * | 6/2001 | Rathburn | 439/66 |
| 6,323,559 B1 | * | 11/2001 | Chan et al. | 257/778 |
| 6,365,421 B2 | * | 4/2002 | Debenham et al. | 438/14 |
| 6,407,929 B1 | * | 6/2002 | Hale et al. | 361/763 |
| 6,617,528 B2 | * | 9/2003 | Armezzani et al. | 174/263 |

OTHER PUBLICATIONS

"Cinch Connectors—CIN: : APSE, High–Speed Interconnect Technology", http://www.cinch.com/products/cinapse/index.html, 4, (Nov. 4, 2000).

"Cinch Connectors—Industries, Computer and Commercial Electronics Markets Segment", http://www.cinch.com/industries/computer/index.html, 1, (Nov. 4, 2000).

"Cinch Connectors–About Cinch", http://www.cinch.com/about/index.html, 1, (Nov. 4, 2000).

* cited by examiner

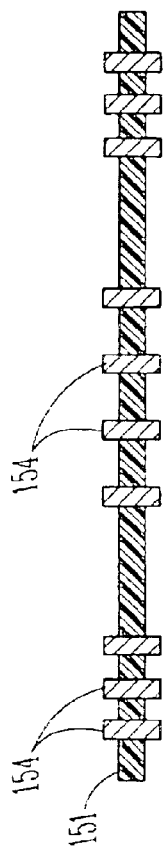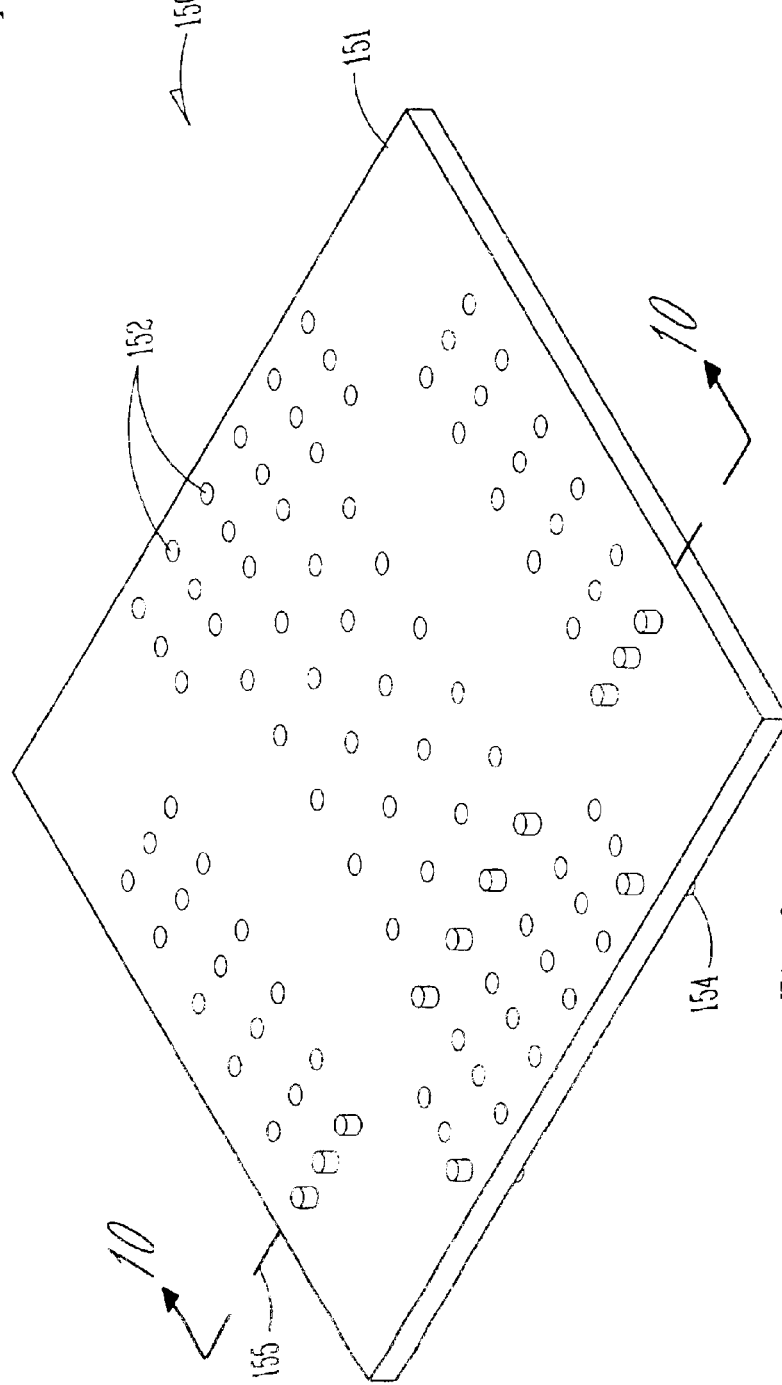

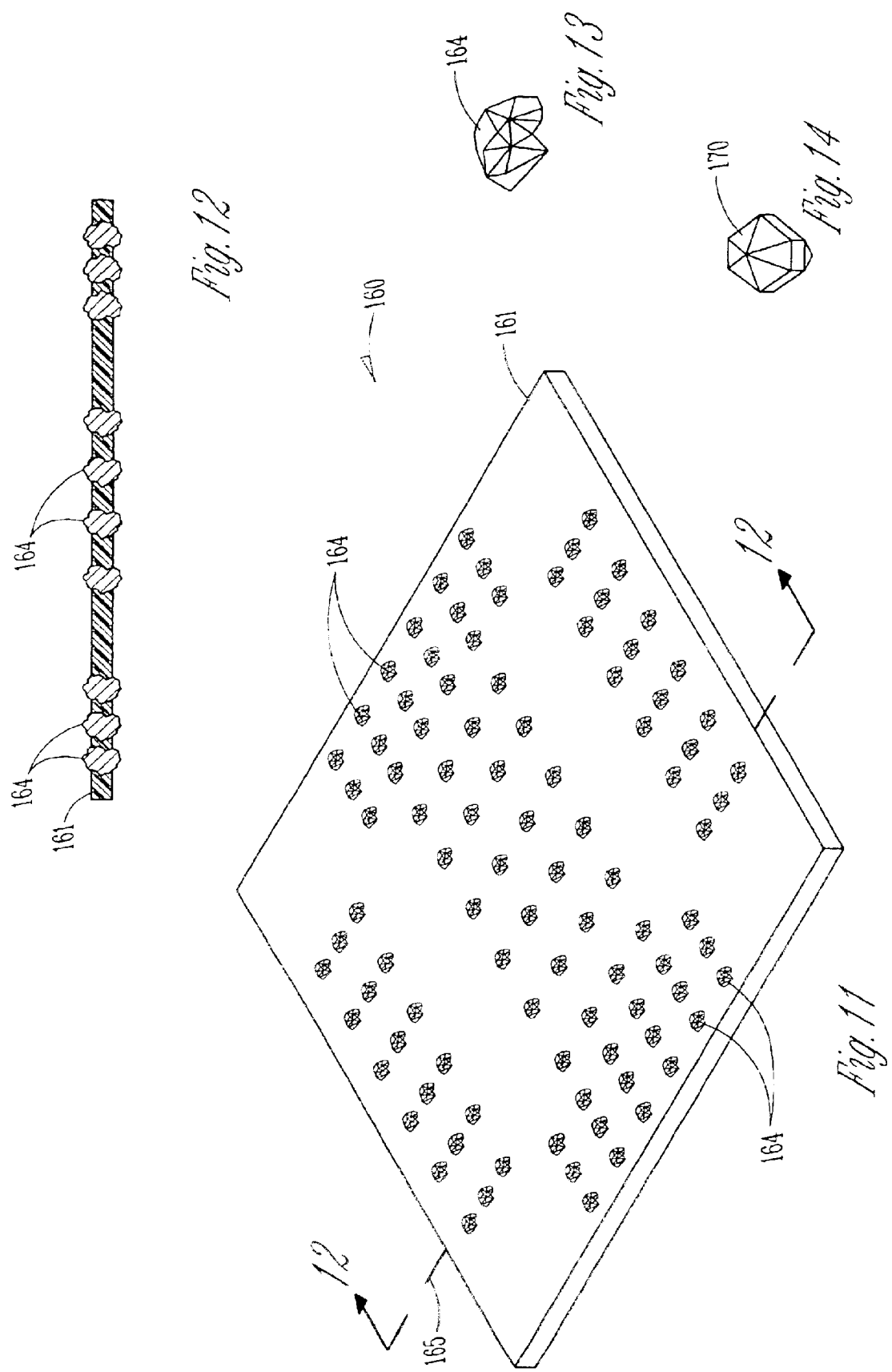

SOLDERLESS ELECTRONICS PACKAGING

TECHNICAL FIELD

The inventive subject matter relates generally to electronics packaging. More particularly, the inventive subject matter relates to an electronic package that includes an integrated circuit package or an integrated circuit coupled to a substrate with a solderless compression connector, and to manufacturing methods related thereto.

BACKGROUND INFORMATION

Integrated circuits (ICs) are typically assembled into electronic packages by physically and electrically coupling them to a substrate made of organic or ceramic material. One or more IC packages can be physically and electrically coupled to a substrate such as a printed circuit board (PCB) or motherboard to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs, where each new generation of packaging must provide increased performance while generally being smaller or more compact in size. As market forces drive equipment manufacturers to produce electronic systems with increased performance and decreased size, IC packaging accordingly also needs to support these requirements. In addition, manufacturers of high-end IC packages, such as processors, are experiencing increasing demand for IC packages mounted in solderless or socketable packaging, because such packaging facilitates easy removal of the IC packages for testing, repair, replacement, and/or upgrading.

An IC substrate may comprise a number of metal layers selectively patterned to provide metal interconnect lines (referred to herein as "traces"), and one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as ICs, of the system. Some ICs have a relatively large number of input/output (I/O) terminals (also called "lands"), as well as a large number of power and ground terminals or lands.

Surface mount technology (SMT) is a widely known technique for coupling ICs to a substrate. One of the conventional methods for surface-mounting an IC on a substrate is called "controlled collapse chip connect" (C4). In fabricating a C4 package, the electrically conductive terminals or lands of an IC component are soldered directly to corresponding lands on the surface of the substrate using reflowable solder bumps or balls. The C4 process is widely used because of its robustness and simplicity. However, it does not provide a solderless or socketable package.

In addition to using SMT to couple an individual IC die to a substrate, whether at the IC package level or at a higher level such as a chip-on-board (COB) multi-chip module, it is also well known to use SMT to couple an IC package to a substrate such as a printed circuit board (PCB) or motherboard. Solder bumps, for example, can be employed between lands on the IC package and corresponding lands on the PCB.

As the internal circuitry of ICs, such as processors, operates at higher and higher clock frequencies, and as ICs operate at higher and higher power levels, the amount of loop inductance produced within IC packages and electronic assemblies can increase to unacceptable levels.

For the reasons stated above, and for other reasons stated below which will become apparent to those skilled in the art upon reading and understanding the present specification, there is a significant need in the art for apparatus and methods for packaging an IC or an IC package on a substrate that provide a socketable connection, that minimize the thickness of the packaging, and that minimize loop inductance within the packaging.

BRIEF DESCRIPTION OF THE DRAWINGS

FIG. 9 illustrates a perspective view of a connector, in accordance with an alternative embodiment of the invention;

FIG. 10 illustrates a cross-sectional representation of the connector of FIG. 9 taken along line 155 of FIG. 9;

FIG. 11 illustrates a perspective view of a connector, in accordance with a second alternative embodiment of the invention;

FIG. 12 illustrates a cross-sectional representation of the connector of FIG. 11 taken along line 165 of FIG. 11;

FIG. 13 illustrates an enlarged perspective view of an electrically conducting element of a connector, in accordance with a second alternative embodiment of the invention;

FIG. 14 illustrates an enlarged perspective view of another embodiment of an electrically conducting element of a connector, in accordance with a second alternative embodiment of the invention;

DETAILED DESCRIPTION

In the following detailed description of embodiments of the inventive subject matter, reference is made to the accompanying drawings which form apart hereof, and in which are shown by way of illustration specific preferred embodiments in which the inventive subject matter may be practiced. These embodiments are described in sufficient detail to enable those skilled in the art to practice the inventive subject matter, and it is to be understood that other embodiments may be utilized and that mechanical, chemical, electrical, and procedural changes may be made without departing from the spirit and scope of the inventive subject matter. Such embodiments of the inventive subject matter may be referred to, individually and/or collectively, herein by the term "invention" merely for convenience and without intending to voluntarily limit the scope of this application to any single invention or inventive concept if more than one is in fact disclosed. The following detailed description is, therefore, not to be taken in a limiting sense, and the scope of embodiments of the present invention is defined only by the appended claims.

The present invention provides a solution to package socketability and thickness limitations and to loop induction problems that are associated with prior art packaging of integrated circuits that operate at high clock speeds and high power levels by eliminating any solder interconnect between an IC package and a PCB and/or between an IC and an IC package substrate. Various embodiments are illustrated and described herein.

In one embodiment, an IC package is mounted to a substrate such as a PCB using a thin, flexible connector. The connector includes an electrically insulating support that contains a plurality of electrically conductive elements (ECEs). The ECEs couple corresponding lands on the IC package and on the substrate. The package structure comprising the IC package, connector, and substrate can be retained by a suitable mechanism, such as an integrated heat spreader in contact with the backside of the die, so that electrical contact is maintained between the lands on the IC package and those on the substrate.

By substituting the thin connector for a solder interconnect, such as solder bumps, the total "stack height" of the package structure, i.e. the height from the upper surface of the die to the lower surface of the substrate, is substantially lower. In addition, by mounting the IC package closer to the substrate, loop inductance is substantially lessened. Further, because the connector is held in place by compression, rather than being soldered, it is readily separated from the IC package, thus enabling a socketable IC package connection. This allows the IC package to be easily removed for test and/or repair, or for the IC package to be replaced with another IC package of equivalent or enhanced functionality.

Figure 1:
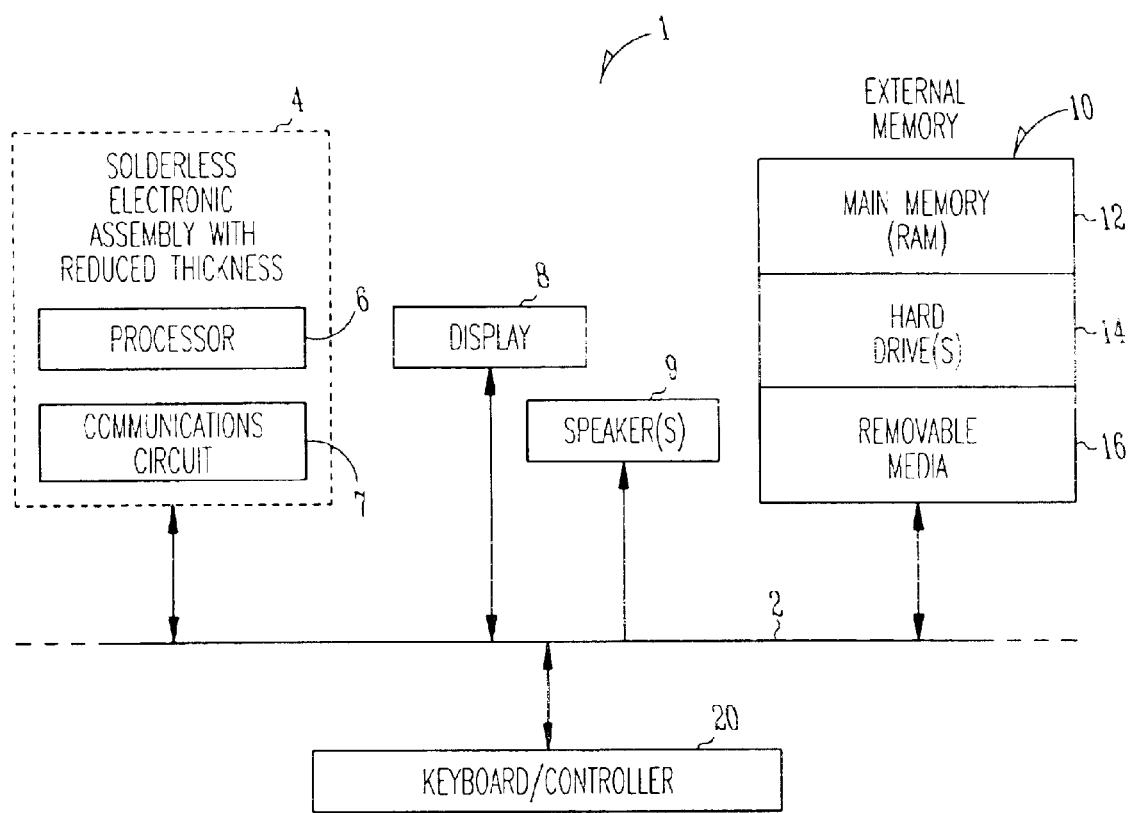
FIG. 1 is a block diagram of an electronic system incorporating at least one solderless electronic assembly with a reduced thickness or stack height in accordance with one embodiment of the invention.

FIG. 1 is a block diagram of an electronic system 1 incorporating at least one solderless electronic assembly 4 with a reduced thickness or stack height in accordance with one embodiment of the invention. Electronic system 1 is merely one example of an electronic system in which embodiments of the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, a speaker 9, and a keyboard and/or controller 20, which can include a mouse, trackball, game controller, voice-recognition device, or any other device that permits a system user to input information into and receive information from the electronic system 1.

Figure 2:
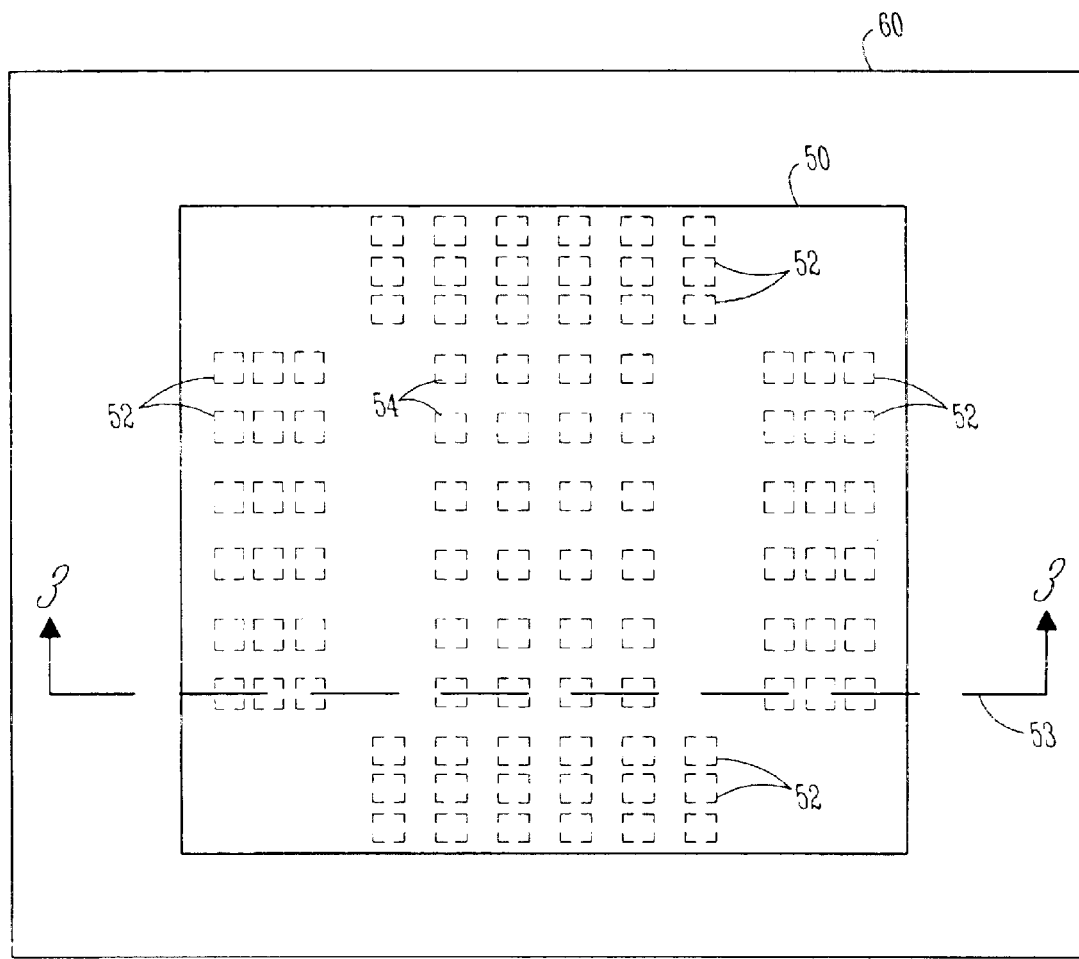
FIG. 2 illustrates a top-view of a die on a substrate in a prior art integrated circuit (IC) package.

FIG. 2 illustrates a top-view of a die 50 on a substrate 60 in a prior art electronic package. In FIG. 2, die 50 comprises a plurality of signal conductors (not shown) that terminate in lands 52 arranged in several rows near the periphery of the bottom surface of die 50. Die 50 also comprises a plurality of power and ground conductors (not shown) that terminate in lands 54 within the central core region of die 50. Lands 52 can be coupled to corresponding lands or signal nodes (not shown) on substrate 60 by appropriate connections such as solder bumps or solder balls (56, FIG. 3). Likewise, lands 54 can be coupled to corresponding lands (not shown) on substrate 60 by appropriate connections such as solder balls 56 (FIG. 3).

In FIG. 2 we are looking through die 50 at lands 52 and 54 (shown in dashed lines) on the bottom surface of die 50. Lands 52 represent signal nodes, while lands 54 represent power supply nodes. As used herein, the term power supply node refers to either a ground node (e.g. Vss) or to a power node at a potential different from ground (e.g. Vcc).

Figure 3:
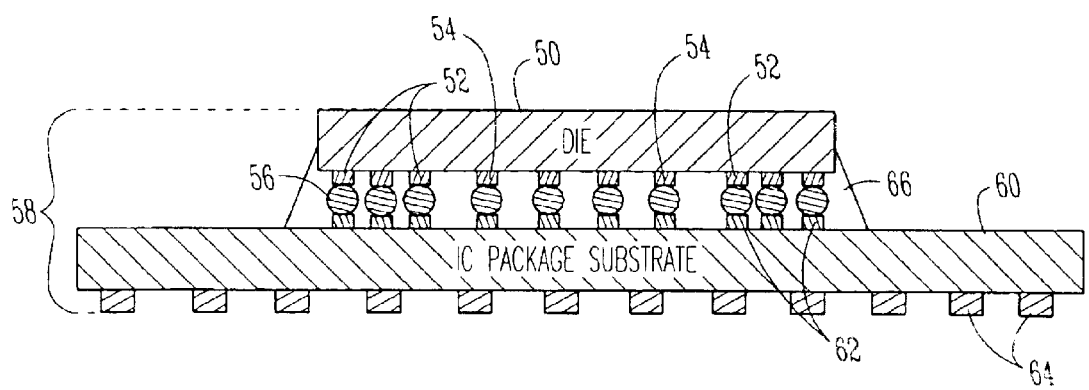
FIG. 3 illustrates a cross-sectional representation of the electronic package of FIG. 2 taken along line 53 of FIG. 2.

FIG. 3 illustrates a cross-sectional representation of the electronic package of FIG. 2 taken along line 53 of FIG. 2. The prior art electronic package includes die 50 having a plurality of signal lands 52 and power supply lands 54 on its lower surface. The package also includes substrate 60, e.g. an IC package substrate, having a plurality of signal and power supply lands 62 on its upper surface and a plurality of signal and power supply lands 64 on its lower surface.

Die 50 is mounted upon substrate 60 through a plurality of solder balls or bumps 56. A solder ball 56 electrically and physically connects a land 52 or 54 of die 50 to its corresponding land 62 of substrate 60. An underfill 66 is typically used to surround solder balls 56 to provide mechanical stability and strength.

As mentioned above, the "stack height" 58 is the distance between the upper surface of die 50 and the lower surface (including lands 64) of substrate 60. It is desirable to minimize the stack height 58 in order to provide an electronics package having minimum thickness and minimal loop inductance.

Figure 4:
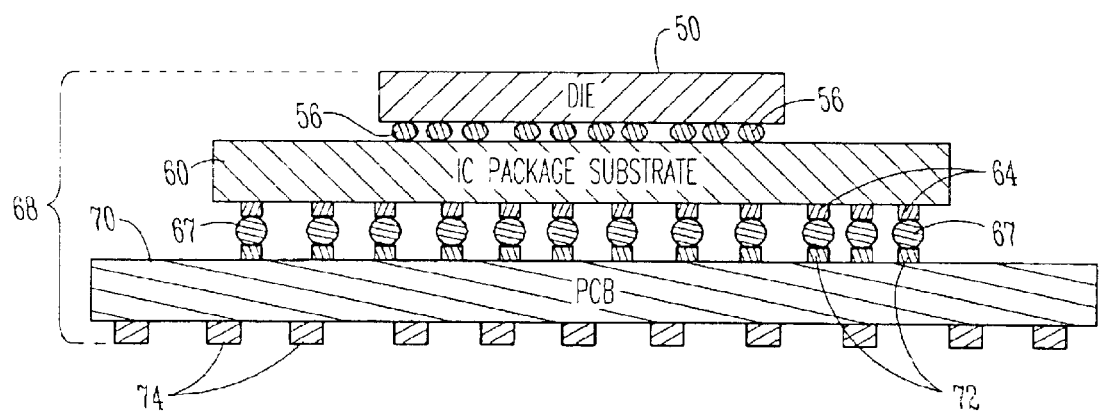
FIG. 4 illustrates a cross-sectional representation of a prior art electronic assembly comprising an IC package mounted on a printed circuit board (PCB)

FIG. 4 illustrates a cross-sectional representation of a prior art electronic assembly comprising an IC package mounted on a printed circuit board (PCB) 70. The IC package is identical to that illustrated in FIGS. 2 and 3. However, lands 52 and 54 on die 50, along with lands 62 on substrate 60, have been omitted for the sake of clarity.

Lands 64 of IC package substrate 60 are coupled to corresponding lands 72 of PCB 70 through solder balls or bumps 67. PCB 70 can optionally have lands 74 on its lower surface for attachment to an additional substrate or other packaging structure.

Regarding the electronic assembly of FIG. 4, the "stack height" 68 is the distance between the upper surface of die 50 and the lower surface (including lands 74) of PCB 70. Again, it is desirable to minimize the stack height 68 in order to provide an electronic assembly having minimum thickness and minimal loop inductance. It is also desirable to provide an alternative to soldering the die to the IC package substrate and/or to soldering the IC package substrate to the PCB, in order to provide socketable components, i.e. ones that can be easily removed and reinserted and/or replaced.

As mentioned earlier, the inventive subject matter provides a solution to package socketability and thickness limitations and to loop induction problems that are associated with prior art packaging of integrated circuits that operate at high clock speeds and high power levels by eliminating any solder interconnect between an IC die and an IC package substrate and/or between an IC package and a PCB. In the ensuing description, the use of a solderless connector in an IC package will first be described, and then the use of a solderless connector in coupling an IC package to a substrate such as a PCB will be described. Finally, an embodiment that employs solderless connectors at two different packaging levels, i.e. both within the IC package and in mounting the IC package to a PCB, will be described.

Figure 5:
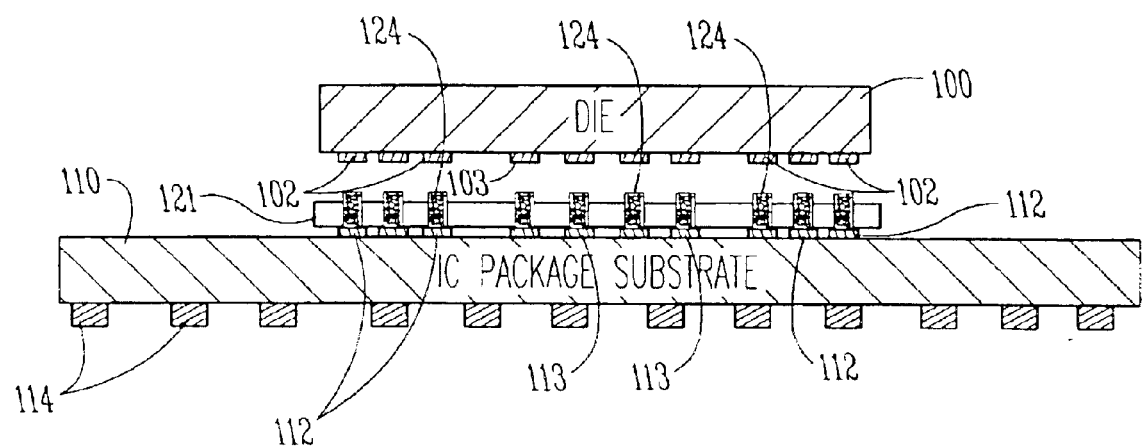
FIG. 5 illustrates a cross-sectional representation of a die aligned for mounting to electrically conducting elements (ECEs) of a connector overlying a substrate, in accordance with one embodiment of the invention.

FIG. 5 illustrates a cross-sectional representation of a die 100 aligned for mounting to electrically conducting elements (ECEs) 124 of a connector (120, FIG. 6) overlying a substrate 110, in accordance with one embodiment of the invention. Die 100 and substrate 110, including their cross-sectional structures as viewed in FIG. 5, are substantially identical to die 50 and substrate 60 and their respective cross-sections as illustrated in FIG. 3. Die 100 comprises a plurality of signal lands 102 and power supply lands 103 on its lower surface. Substrate 110 comprises a plurality of signal lands 112 and power supply lands 113 on its upper surface, and it comprises a plurality of signal and power supply lands 114 on its lower surface. Substrate 110 can be a multi-layered substrate or a single-layered substrate.

In the embodiment shown in FIG. 5, the connector comprises a thin, flexible, electrically insulating support 121. Support 121 is shown in cross-section in FIG. 5 along line 125 of FIG. 6. Support 121 comprises a plurality of ECEs 124. A portion of ECEs 124 are aligned with corresponding signal lands 102 on die 100 and with signal lands 112 on substrate 110. Another portion of ECEs 124 are aligned with corresponding signal lands 103 on die 100 and with signal lands 113 on substrate 110.

ECEs 124 can be formed of any suitable electrically conductive material. In the embodiment shown in FIG. 5, ECEs 124 comprise a compressible material such as a wire button contact or wire wad, discussed with reference to FIG. 7 below. In FIG. 5, ECEs 124 are uncompressed, because their upper ends are not touching lands 102 and 103. Thus the upper ends of ECEs 124 are illustrated as extending above the upper surface of support 121.

It will be understood that the structures illustrated in FIG. 5 are not drawn to scale. For purposes of illustration, support 121 and ECEs 124 are shown substantially thicker than they are in actuality, relative to the thickness of die 100.

Figure 6:
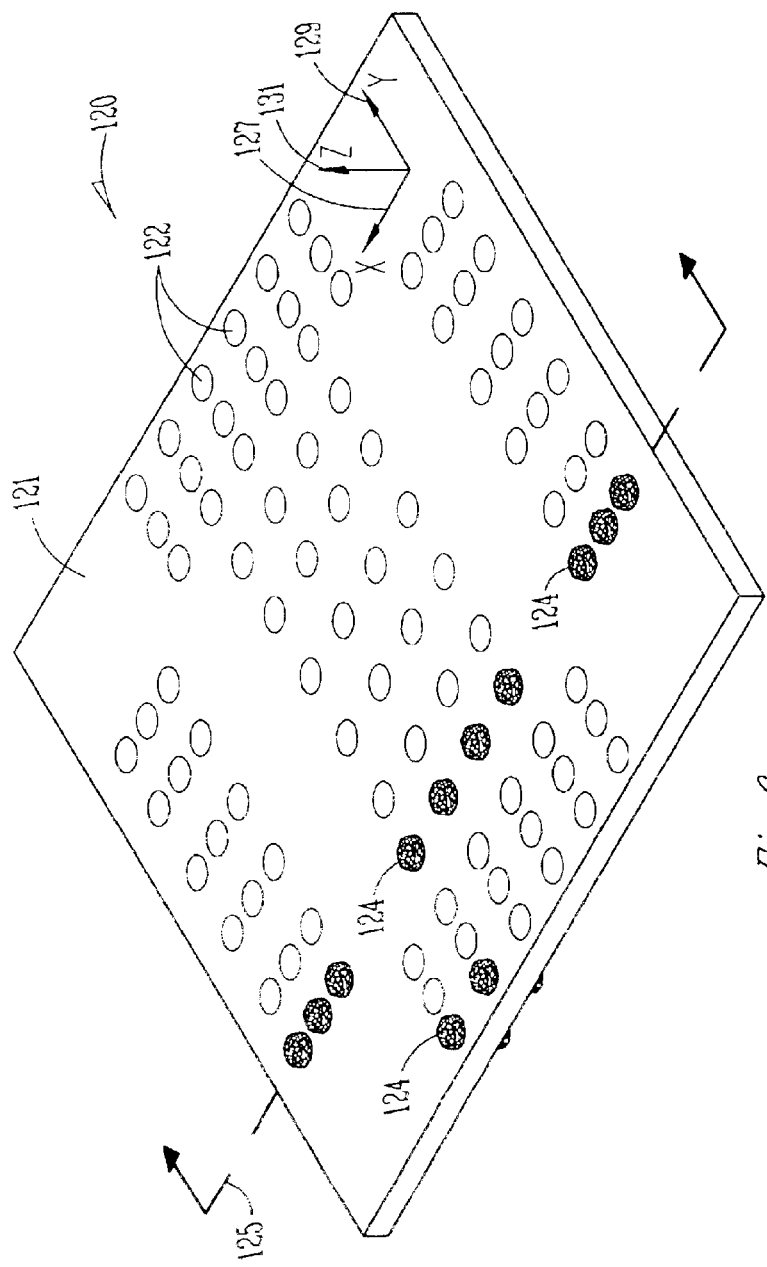
FIG. 6 illustrates a perspective view of a connector, in accordance with one embodiment of the invention.

FIG. 6 illustrates a perspective view of a connector 120, in accordance with one embodiment of the invention. Connector 120 comprises a thin, flexible, electrically insulating support 121. Support 121 can be formed of any suitable insulating material such as, but not limited to, a plastic or polymer. Support 121 comprises a plurality of apertures or holes 122 in a pattern that substantially matches that of lands 102/103 on die 100 (FIG. 5) and lands 112/113 on substrate 110 (FIG. 5), in terms of pitch and placement.

Each hole 122 of support 121 has an ECE 124. In the embodiment shown, ECEs 124 comprise compressible wire wads such as that illustrated in FIG. 7. ECEs 124 in their uncompressed form extend outwardly from one or both surfaces of support 121. Support 121 retains ECEs 124 substantially immobile in holes 122 with respect to an X axis 127 and a Y axis 129, but it allows the electrically conductive elements to move within holes 122 with respect to a Z axis 131.

Connector 120 can be a modified version of an electrical connection system known under the trade name CIN::APSE and commercially available from Cinch Connectors, Lombard, Ill., U.S.A. Product information on the CIN::APSE interconnect technology is currently obtainable from the Internet at a URL that includes "cinch.com/products" (To avoid inadvertent hyperlinks, the "http://www" has been omitted from the foregoing URL.)

The known CIN::APSE connection system differs in several significant respects from connector 120. First, the CIN::APSE connection system incorporates a socket fixture on the order of several millimeters in thickness between the IC die and the substrate. By contrast, the inventive subject matter does not incorporate a socket fixture, so the thickness of support 121 of connector 120 can range from a few tenths of a millimeter down to 0.05 mm and possibly thinner. In an embodiment, support 121 is of relatively uniform thickness, and it has upper and lower sides.

Secondly, the minimum compressed thickness of the wire wads employed in the CIN::APSE connection system is described in available product literature as 0.8 mm. By contrast, the compressed thickness of the wire wads used in one embodiment of connector 120 is 0.10 mm.

Thus, the thickness of the connector 120 achievable with one embodiment of the invention is approximately 0.10 mm. This thickness is approximately 1/100th the thickness of a typical socket in the CIN: APSE connection system. Moreover, it is approximately 20% thinner than the thickness of reflowed solder balls in a typical ball grid array (BGA) system, such as that illustrated in FIG. 3.

Figure 7:
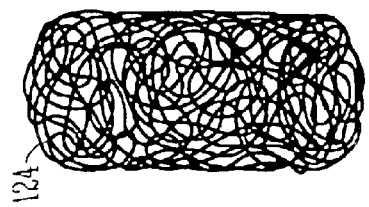
FIG. 7 illustrates an enlarged perspective view of an electrically conducting element of a connector, in accordance with one embodiment of the invention.

FIG. 7 illustrates an enlarged perspective view of an electrically conducting element (ECE) 124 of a connector 120, in accordance with one embodiment of the invention. ECE 124 comprises a cylindrical or hourglass shaped wad of conductive, elastic metal wire. Any suitable metal, such as molybdenum or tungsten can be used. The metal can be plated with a suitable, highly conductive material such as gold.

Figure 8:
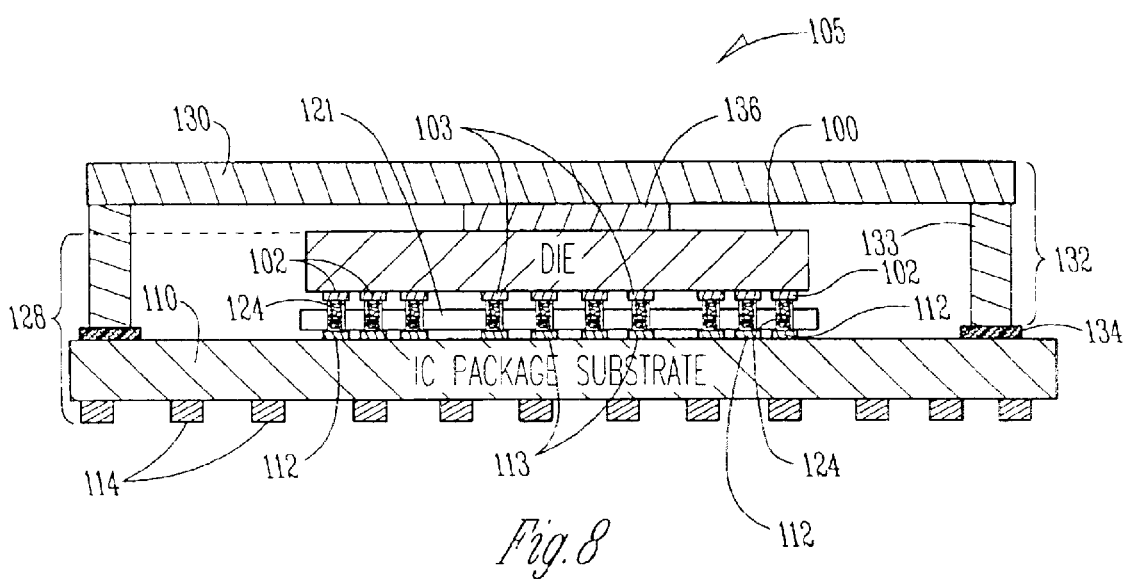
FIG. 8 illustrates a cross-sectional representation of an integrated circuit package, in accordance with one embodiment of the invention.

FIG. 8 illustrates a cross-sectional representation of an integrated circuit (IC) package 105, in accordance with one embodiment of the invention. The IC package 105 of FIG. 8 includes the same die 100, connector support 121, and substrate 110 shown in FIG. 5.

In FIG. 8, the lands 102/103 of die 100 are in contact with ECEs 124. A compression element in the form of an integrated heat spreader (IHS) 132 is located over the die 100. IHS 132 comprises a lid 130 and a wall or support member 133. IHS 132 can be mechanically supported by coupling its support member 133 to the upper surface of substrate 110 through a suitable attachment mechanism such as sealant 134. In one embodiment, the IHS support member 133 is located at the periphery of IHS 132. However, in other embodiments the lid 130 of IHS 132 can extend beyond the support member 133.

IHS 132 also comprises a compression member 136 that is in contact with the upper surface of die 100, forcing the lands 102/103 of die 100 into secure physical and electrical contact with ECEs 124. ECEs 124 are accordingly compressed into the positions shown in FIG. 8. Compression member 136 can be any suitable mechanism for applying compression force, such as a metal spring, a resilient material, wire wad, etc. Compression member 136 can also be a non-resilient substance that is sandwiched between lid 130 and die 100; in this case the height and compression effect of the IHS 132 can be appropriately adjusted via the thickness of attachment mechanism or sealant 134.

The resulting stack height 128 of IC package 105 is significantly less than that of the prior art IC package illustrated in FIG. 3. Integrated circuit (IC) package 105 can form part of electronic assembly 4 shown in FIG. 1. Die 100 can be of any type. In one embodiment, die 100 is a processor.

FIG. 9 illustrates a perspective view of a connector 150, in accordance with an alternative embodiment of the invention. In this alternative embodiment of the invention, connector 150 is substituted for connector 120 (FIG. 6) in IC package 105 (FIG. 8).

Connector 150 comprises an electrically insulating support 151. Support 151 can be formed of any suitable insulating material such as, but not limited to, a plastic or polymer. Support 151 comprises a plurality of holes 152 in a pattern that substantially matches that of lands 102/103 on die 100 (FIG. 8) and lands 112/113 on substrate 110 (FIG. 8), in terms of pitch and placement.

Each hole 152 of support 151 has an ECE 154. In the embodiment shown, ECEs 154 comprise fine pins, spindles, or fibers formed of an electrically conductive material such as copper. ECEs 154 could alternatively be formed of any other suitable conductive material such as aluminum, antimony, beryllium, bismuth, cadmium, carbon, chromium, gold, iron, lead, magnesium, manganese, molybdenum, nickel, palladium, platinum, silicon, silver, tin, titanium, tungsten, zinc, or a combination of these materials. ECEs 154 could also be formed from a metal silicide, doped polysilicon, or plastic coated with a conductive material. In one embodiment, copper pins are plated with a suitable, highly conductive material such as gold.

FIG. 10 illustrates a cross-sectional representation of the connector 150 of FIG. 9 taken along line 155 of FIG. 9. ECEs 154 extend outwardly from one or both surfaces of support 151. While ECEs 154 are shown, for purposes of illustration, as extending considerably outwardly, in practice they extend only very slightly beyond the surfaces of support 151. They should extend sufficiently to make proper electrical contact with their respective lands, but they should not extend so far that adjacent ECEs 154 come into contact or that ECEs 154 do not contact the correct land(s) on the IC or substrate.

The particular geometry of the embedded ECEs 154 is very flexible in terms of their orientation, size, number, and location. For example, the ends of ECEs 154 could be tapered or pointed. ECEs 154 need not be perfectly cylindrical pins, but rather they can be of any suitable geometry that extends through support 151. For example, ECEs 154 could have cross-sections of any geometric shape, such as planes, triangles, squares, rectangles, pentagons, hexagons, and so forth. In addition to the regular geometric objects just mentioned, ECEs 154 could be irregular geometric objects of any cross-section, including of varying cross-section along the length of any given ECE 154 and within a group of ECEs 154. In addition, different types of ECEs 154 can be used in one connector 150.

FIG. 11 illustrates a perspective view of a connector 160, in accordance with a second alternative embodiment of the invention. In the second alternative embodiment of the invention, connector 160 is substituted for connector 120 (FIG. 6) in IC package 105 (FIG. 8).

Connector 160 comprises a microcrystalline film or an anisotropic conducting film (ACF). ACFs are well known to those of ordinary skill in the art and are commercially available. A suitable ACF can comprise, for example, ECEs 164 in the form of conductive particles dispersed in an electrically insulating binder or support 161 such as an epoxy-based resin. The resin can be, for example, a curable resin (e.g. through heat, pressure, ultraviolet light, or a combination thereof), but other thin, flexible films, carriers, or sheets whose dielectric constant is fairly small could also be used. If a curable resin is used, it is used in an uncured or partially cured form, in order to allow die 100 (FIG. 5) to be readily removed from connector 160 (FIG. 11) for any reason, such as to test, repair, replace, or upgrade die 100.

ECEs 164 can be of any suitable shape, size, number, location, orientation, and composition. In one embodiment, ECEs 164 are tiny crystals of a crystalline substance, such as a salt. In another embodiment, ECEs 164 are relatively non-compressible particles of irregular, non-cylindrical shape, such as pieces of silicon, glass, quartz, diamond, and so forth. In yet another embodiment, ECEs 164 are relatively non-compressible particles of conducting metal or metal alloy from the group consisting of aluminum, antimony, beryllium, bismuth, cadmium, carbon, chromium, copper, gold, iron, lead, magnesium, manganese, molybdenum, nickel, palladium, platinum, silicon, silver, tin, titanium, tungsten, and zinc. ECEs 164 could also be formed from a metal silicide or doped polysilicon. In another embodiment, ECEs 164 comprise small, compressible spheres formed, for example, of a polymer or other plastic.

Irrespective of what ECEs 164 are formed of, ECEs 164 can comprise a coating of gold, silver, or other substance for improved electrical conductivity and oxidation resistance. The coating can be applied by any appropriate technique, such as sputtering or electroless plating.

ECEs 164 can comprise regular geometric objects, such as spheres, ovaloids, cubes, parallelepipeds, cylinders, hourglasses, back-to-back cones, and the like. ECEs 164 can also comprise irregular non-cylindrical geometric objects, such as blobs, lumps, broken or crushed particles, and other irregular forms.

ECEs 164 are in a pattern that substantially matches that of lands 102/103 on die 100 (FIG. 8) and lands 112/113 on substrate 110 (FIG. 8), in terms of pitch and placement.

FIG. 12 illustrates a cross-sectional representation of the connector 160 of FIG. 11 taken along line 165 of FIG. 11. ECEs 164 of irregular geometry are held within support 161. ECEs 164 extend between the upper and lower sides of support 161, and they project slightly from both surfaces of support 161. In an embodiment, ECEs 164 have a dimension equal to or exceeding the thickness of the flexible support 161. In one embodiment, the outward projections of ECEs 164 have relatively sharp tips to enable ECEs 164 to slightly penetrate lands 102/103 on die 100 (FIG. 8) and lands 112/113 on substrate 110 (FIG. 8) when the stack is compressed together by IHS 132 (FIG. 8).

FIG. 13 illustrates an enlarged perspective view of an electrically conducting element 164 of a connector 160, in accordance with a second alternative embodiment of the invention. ECE 164 is an asymmetrical fragment of conductive material, such as carbon, or of a non-conductive material, such as glass, silicon, etc., that is coated with an electrically conductive material, such as gold or silver. ECE 164 is an example of an irregular geometric object. ECE 164 can be used in the embodiment of the connector 160 shown in FIG. 11.

FIG. 14 illustrates an enlarged perspective view of another embodiment of an electrically conducting element (ECE) 170 of a connector 160, in accordance with a second alternative embodiment of the invention. ECE 170 is a crystal. The crystal illustrated is an example of a regular geometric object. ECE 170 can be substituted for ECE 164 in the embodiment of the connector 160 shown in FIG. 11.

Figure 15:
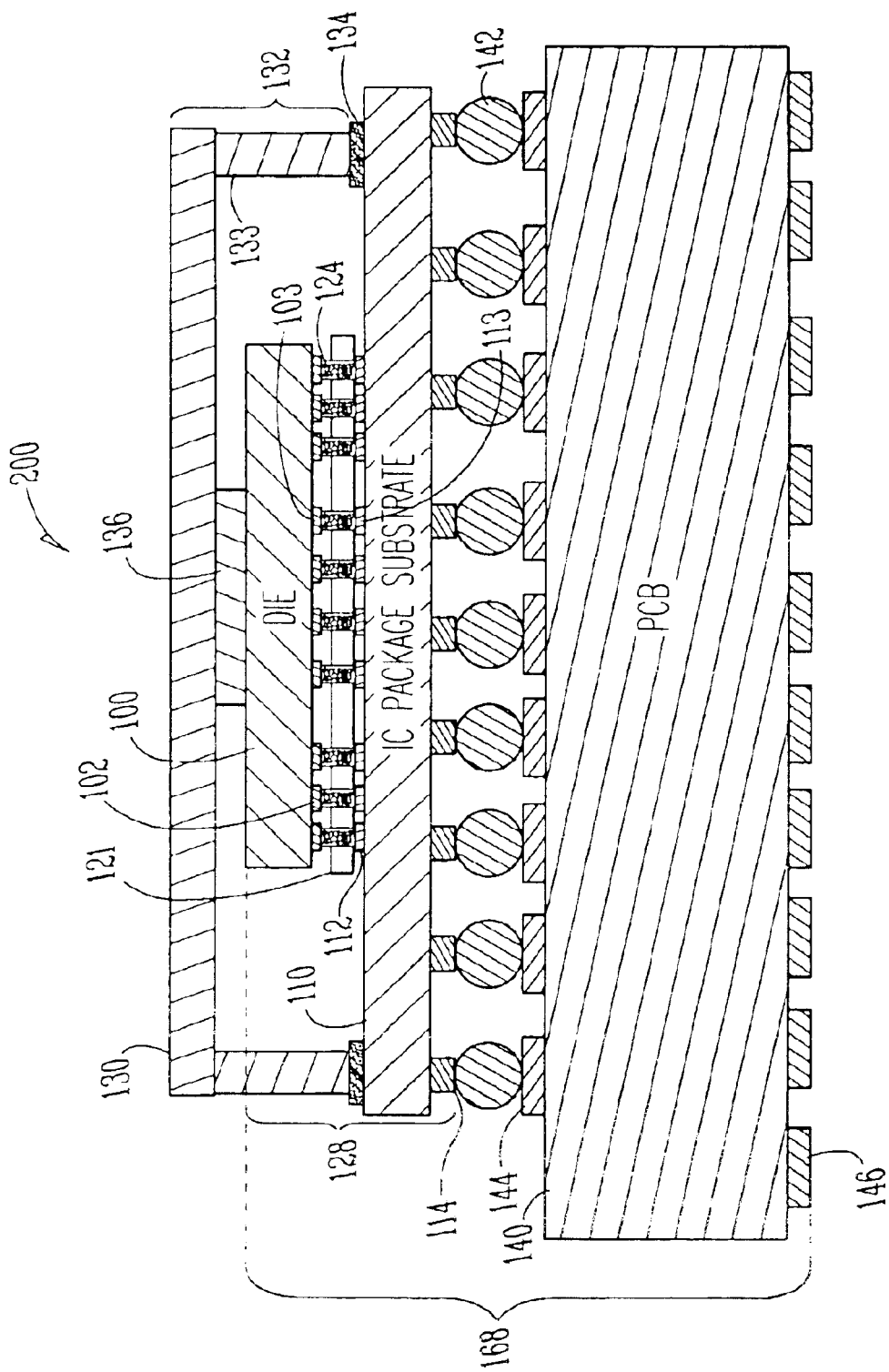
FIG. 15 illustrates a cross-sectional representation of an electronic assembly comprising a reduced-height IC package mounted on a substrate, in accordance with one embodiment of the invention.

FIG. 15 illustrates a cross-sectional representation of an electronic assembly 200 comprising a reduced-height IC package mounted on a substrate 140, in accordance with one embodiment of the invention. The IC package of FIG. 15 includes the same die 100, connector support 121, substrate 110, and IHS 132 as are illustrated for the IC package of FIG. 8.

To form an electronic assembly 200, the IC package is mounted on substrate or PCB 140 by coupling the lands 114 on the bottom surface of IC package substrate 110 with corresponding lands 144 on the upper surface of substrate 140 via a suitable conductive material such as solder balls or bumps 142.

Substrate 140 can be of any type, such as a printed circuit board (PCB) or card, a motherboard, or any other type of packaging element. Substrate 140 can be a multi-layered substrate or a single-layered substrate. Embodiments of the inventive subject matter are not to be construed as limited to any particular type of substrate 140 or to any particular method of coupling IC package 105 (FIG. 8) to substrate 140. Substrate 140 can optionally have lands 146 on its lower surface for attachment to an additional substrate or other packaging structure.

As noted earlier regarding FIG. 8, the stack height 128 of the IC package is significantly less than that of the prior art IC package illustrated in FIG. 3. This reduces the overall stack height 168 of the electronic assembly 200, as measured from the top of the die to the bottom of the PCB 140 (including lands 146), relative to the prior art electronic assembly illustrated in FIG. 4.

Figure 16:
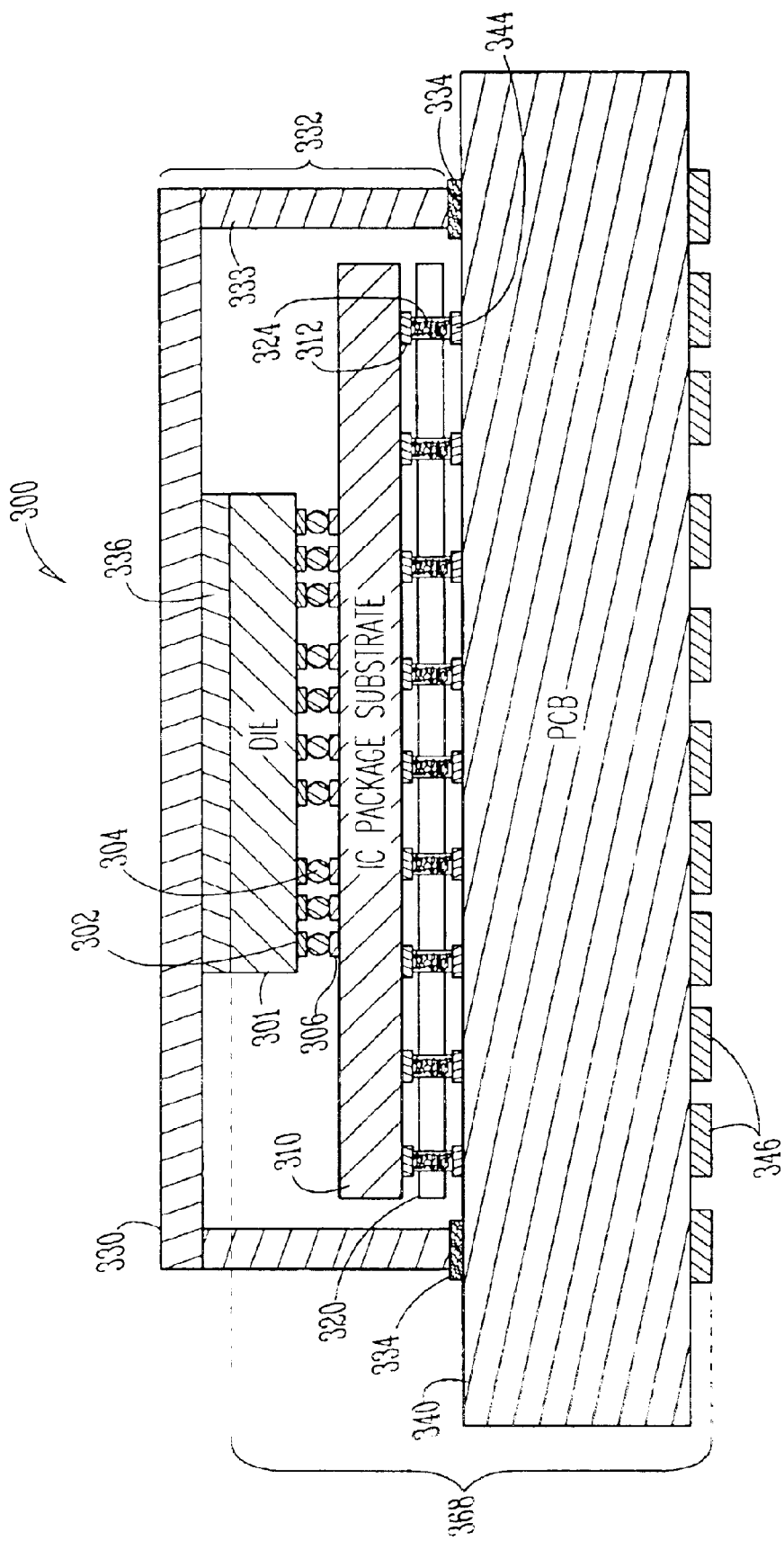
FIG. 16 illustrates a cross-sectional representation of an electronic assembly comprising an IC package mounted on a substrate using a reduced-height connector, in accordance with another embodiment of the invention.

FIG. 16 illustrates a cross-sectional representation of an electronic assembly 300 comprising an IC package mounted on a substrate 340 using a reduced-height connector, in accordance with another embodiment of the invention. The basic structure of the IC package of FIG. 16 can be like that of a typical prior art IC package, as illustrated for example in FIG. 3, in that it comprises a die 301 having lands 302 coupled via solder bumps 304 to corresponding lands 306 on an IC package substrate 310.

The IC package is coupled to a substrate 340, such as a PCB or motherboard, using a solderless connector that comprises a support 320 and a plurality of ECEs 324. Each ECE 324 couples a land 312 on the lower surface of IC package substrate 310 with a corresponding land 344 on the upper surface of substrate 340. Substrate 340 can optionally have lands 346 on its lower surface for attachment to an additional substrate or other packaging structure.

In order to maintain the ECEs 324 in contact with their respective pairs of lands 312/344, a compression element in the form of an integrated heat spreader (IHS) 332 is located over the IC package. IHS 332 comprises a lid 330 and a wall or support member 333. IHS 332 can be mechanically supported by coupling its support member 333 to the upper surface of substrate 340 through a suitable attachment mechanism, such as sealant 334. In one embodiment, the IHS support member 333 is located at the periphery of IHS 332. However, in other embodiments the lid 330 of IHS 332 can extend beyond the support member 333.

IHS 332 also comprises a compression member 336 that is in contact with the upper surface of die 301, forcing the lands 312 of die 301 into secure physical and electrical contact with ECEs 324. ECEs 324 are accordingly compressed into the positions shown in FIG. 16. Compression member 336 can be any suitable mechanism for applying compression force, such as a metal spring, a resilient material, wire wad, etc. Compression member 336 can also be a non-resilient substance that is sandwiched between lid 330 and die 301; in this case the height and compression effect of IHS 332 can be appropriately adjusted via the thickness of attachment mechanism or sealant 334.

The resulting stack height 368 of electronic assembly 300 is significantly less than that of the prior art electronic assembly illustrated in FIG. 4. For example, if a support 320 having a thickness of 0.1 mm is used in the embodiment shown in FIG. 16, the resulting overall stack height is approximately 20% less than the stack height of the prior art electronic assembly illustrated in FIG. 4, assuming the thicknesses of the die, the IC package substrate, and the PCB are held constant.

Figure 17:
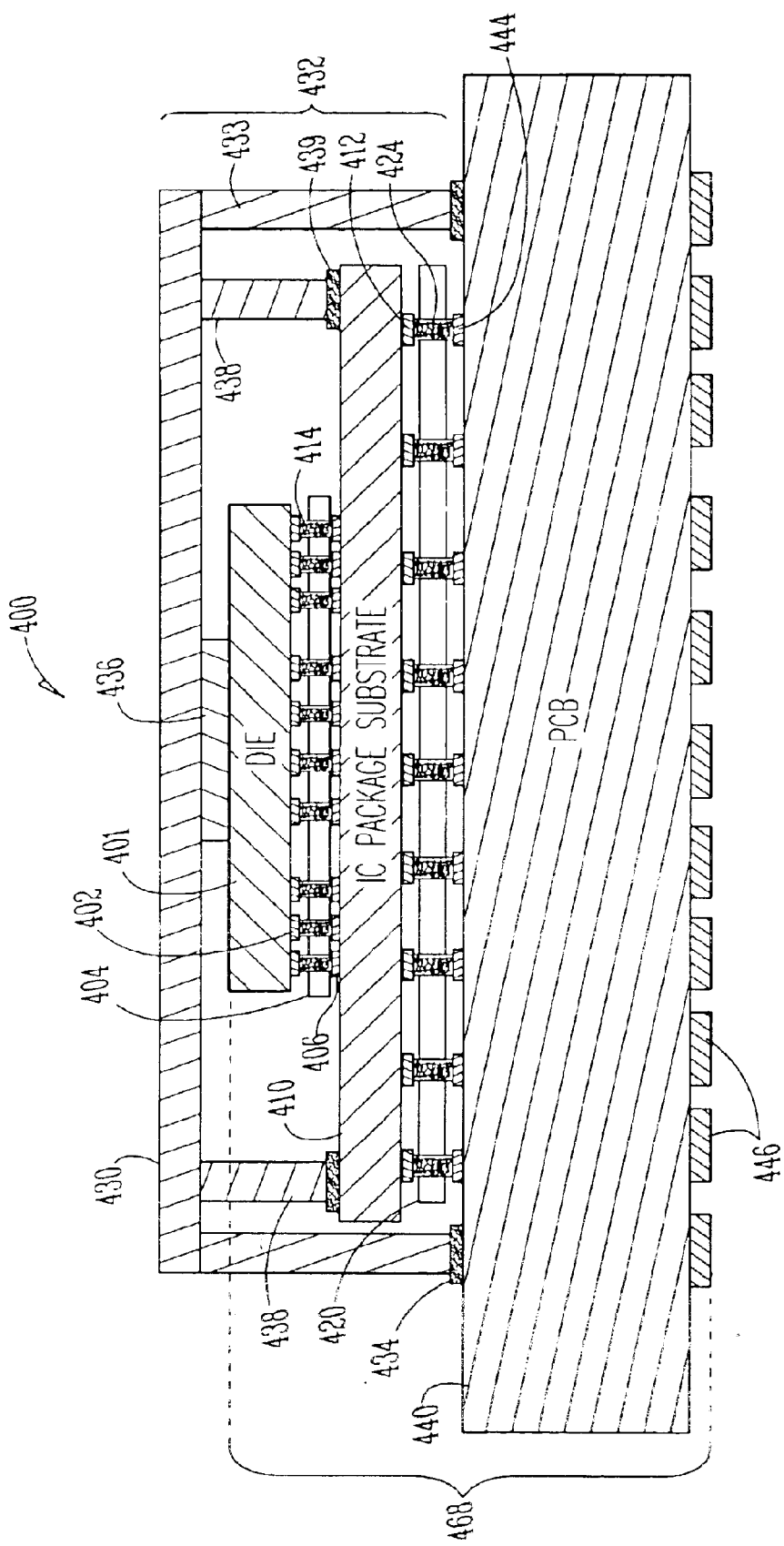
FIG. 17 illustrates a cross-sectional representation of an electronic assembly comprising a reduced-height IC package mounted on a substrate using a reduced-height connector, in accordance with another embodiment of the invention.

FIG. 17 illustrates a cross-sectional representation of an electronic assembly 400 comprising a reduced-height IC package mounted on a substrate 440 using a reduced-height connector, in accordance with another embodiment of the invention. Electronic assembly 400 is similar to electronic assembly 300 (FIG. 16). However, in electronic assembly 400 a reduced-height connector has been employed within the IC package (i.e., between die 401 and IC package substrate 410) as well as for mounting the IC package upon substrate 440.

The basic structure of the IC package of FIG. 17 can be like that of IC package 105 illustrated in FIG. 8, in that it comprises a die 401 having lands 402 coupled via ECEs 414 mounted within a solderless support 404 to corresponding lands 406 on an IC package substrate 410.

This IC package is coupled to a substrate 440, such as a PCB or motherboard, using a solderless connector that comprises a support 420 and a plurality of ECEs 424. Each ECE 424 couples a land 412 on the lower surface of IC package substrate 410 with a corresponding land 444 on the upper surface of substrate 440. Substrate 440 can optionally have lands 446 on its lower surface for attachment to an additional substrate or other packaging structure.

In order to maintain the ECEs 414 in contact with their respective pairs of lands 402/406, a compression element in the form of an integrated heat spreader (IHS) 432 is located over the IC package. IHS 432 comprises a lid 430, an inner wall or support member 438, and an outer wall or support member 433.

During assembly of the IC package, IHS support member 438 is mechanically coupled via a suitable mechanism, such as sealant 439, to the upper surface of IC package substrate 410. IHS 430 also comprises a compression member 436 that is in contact with the upper surface of die 401 to force lands 402/406 against ECEs 414 of support 404 and to maintain proper physical and electrical contact.

Subsequently, during mounting of the IC package on substrate 440, IHS support member 433 is mechanically coupled via a suitable mechanism, such as sealant 434, to the upper surface of substrate 440. Compression member 436 forces lands 412 of IC package substrate 410 and lands 444 of substrate 440 into secure physical and electrical contact with ECEs 424. ECEs 424 are accordingly compressed into the positions shown in FIG. 17.

Compression member 436 can be any suitable mechanism for applying compression force, such as a metal spring, a resilient material, wire wad, etc. Compression member 436 can also be a non-resilient substance that is sandwiched between lid 430 and die 401; in this case the height and compression effect of IHS 432 can be appropriately adjusted via the thicknesses of attachment mechanisms or sealants 434 and 439.

In one embodiment, IHS support member 438 is located at the periphery of IC package substrate 410, and IHS support member 433 is located at the periphery of IHS 432. However, in other embodiments, support member 438 can be located closer to die 401, and the lid 430 of IHS 432 can extend outwardly beyond the support member 433.

Also, in other embodiments, a different support and/or attachment mechanism can be substituted for support member 438 and/or support member 433, and their respective sealants 439 and 434, in order to maintain die 401, IC package substrate 410, and substrate 440 in proper alignment and in secure physical and electrical contact. In these other embodiments, either or both support members 438 and 433 could be eliminated, depending upon the type of structure that is used to align and secure die 401, IC package substrate 410, and substrate 440.

The resulting stack height 468 of electronic assembly 400 is significantly less than that of the prior art electronic assembly illustrated in FIG. 4. As mentioned earlier, it will be understood that the structures illustrated in FIG. 17 are not drawn to scale. For purposes of illustration, the solderless compression connectors are shown substantially thicker than they are in actuality, relative to the thickness of die 401 and IC package substrate 410.

Several methods for fabricating an IC package in accordance with at least one embodiment discussed above will now be described.

Figure 18:
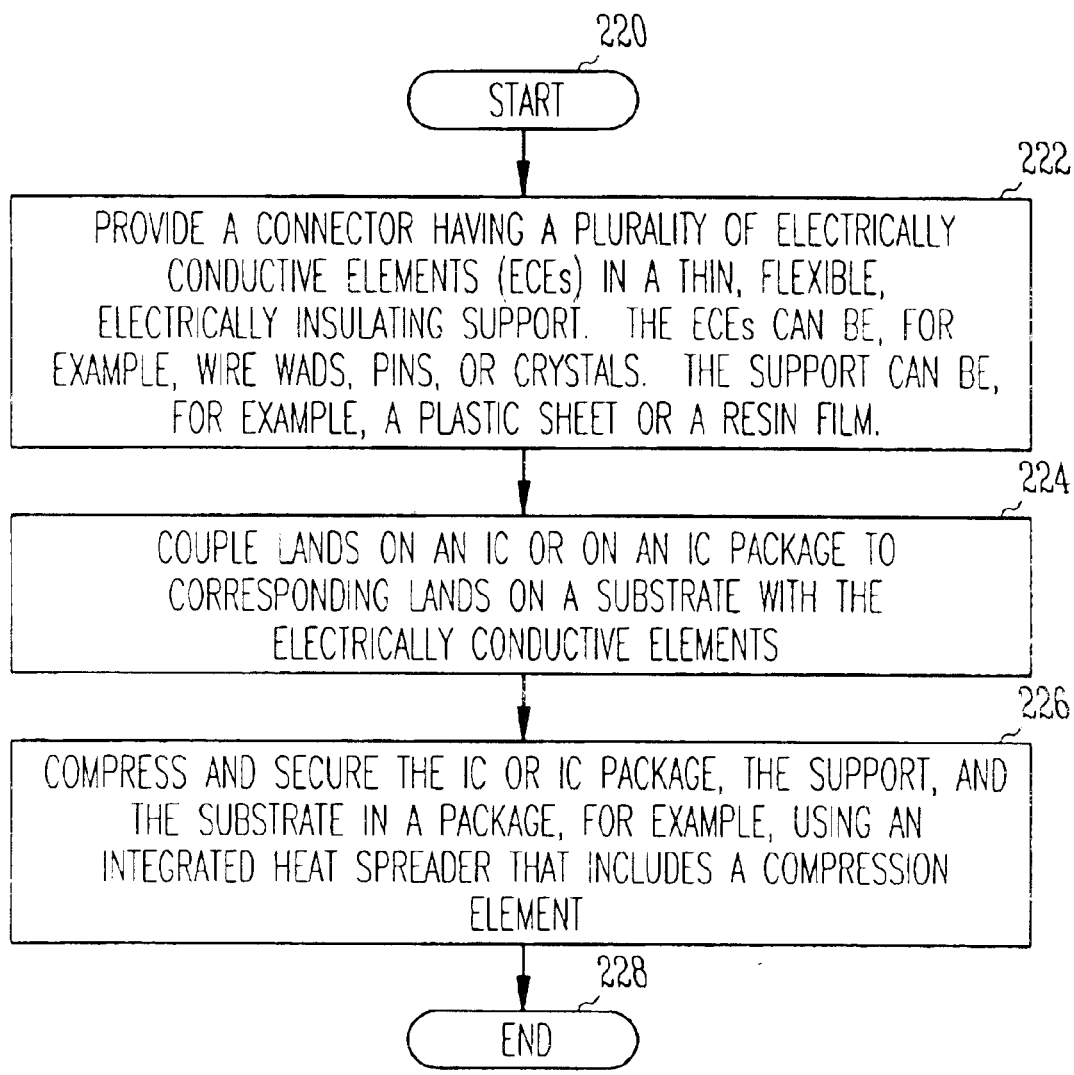
FIG. 18 is a flow diagram illustrating a method of packaging an IC or of mounting an IC package on a substrate, in accordance with two alternative embodiments of the invention.

FIG. 18 is a flow diagram illustrating a method of packaging an IC or of mounting an IC package on a substrate, in accordance with two alternative embodiments of the invention. The method starts at 220.

In 222, a connector is provided having a plurality of electrically conductive elements (ECEs) in a thin, flexible, electrically insulating support. Merely by way of example, the ECEs can be wire wads (124, FIG. 7), pins (154, FIG. 9), or crystals (170, FIG. 14). The electrically insulating support can be, for example, a plastic sheet (support 121, FIG. 6) or a resin film (support 161, FIG. 11).

In 224, the lands on an IC (die 100, FIG. 8) are coupled to corresponding lands on a substrate (110, FIG. 8) with the ECEs. Alternatively, the lands on an IC substrate (310, FIG. 16) are coupled to corresponding lands on a substrate such as a PCB (340, FIG. 16).

In 226, the IC or IC package, the support, and the substrate are compressed and secured in a package, for example, using an integrated heat spreader (132, FIG. 8; or 332, FIG. 16) that includes a compression element (136, FIG. 8; or 336, FIG. 16). The method ends at 228.

Figure 19:
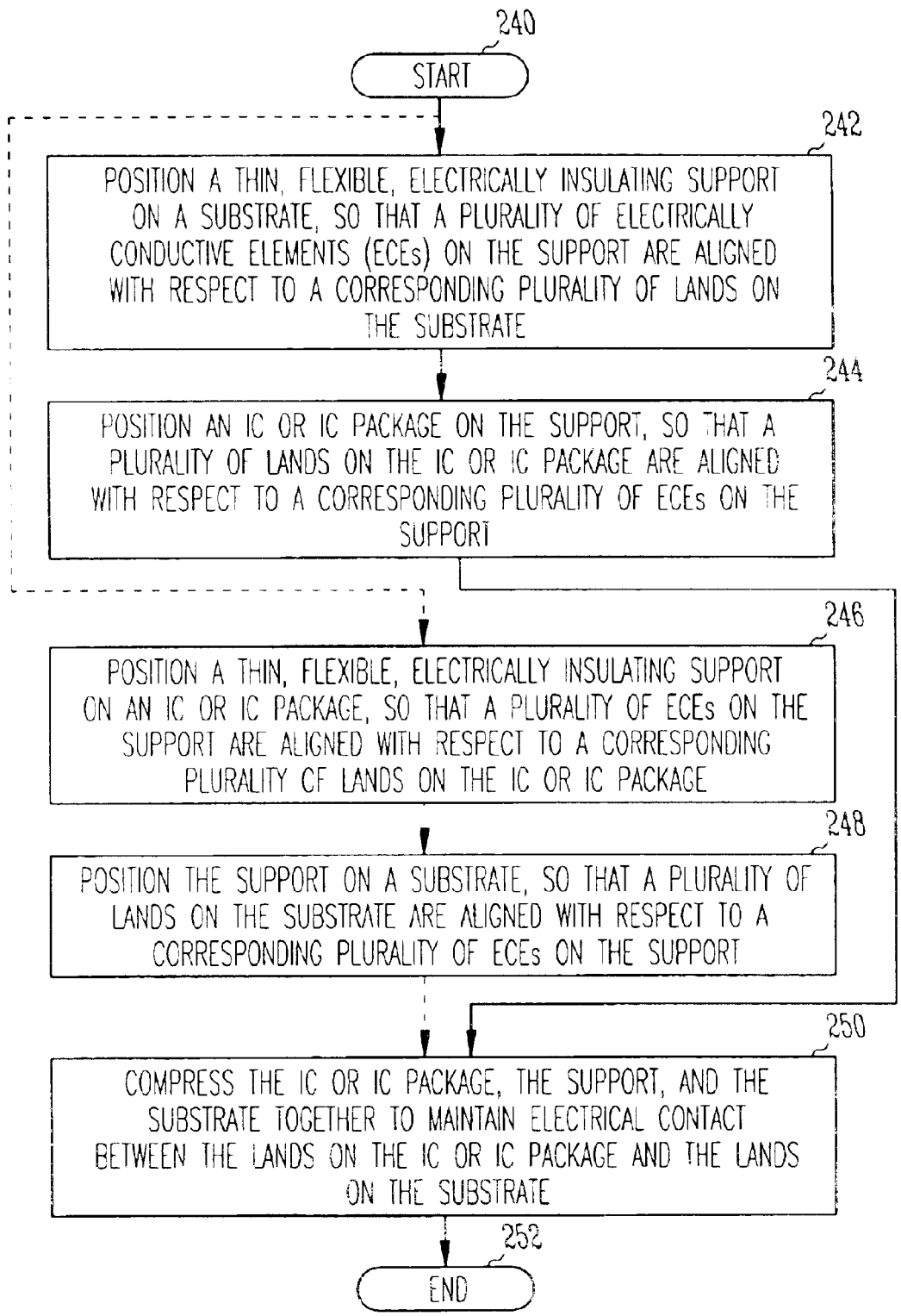
FIG. 19 is a flow diagram illustrating two alternative methods of packaging an IC and two alternative methods of mounting an IC package on a substrate, in accordance with alternative embodiments of the invention.

FIG. 19 is a flow diagram illustrating two alternative methods of packaging an IC and two alternative methods of mounting an IC package on a substrate, in accordance with alternative embodiments of the invention. The methods begin at 240. One method of packaging an IC or of mounting an IC package on a substrate comprises operations 242, 244, and 250. An alternative method of packaging an IC or of mounting an IC package on a substrate comprises operations 246, 248, and 250. The methods differ in the order in which an IC or IC package, a connector, and a substrate are coupled.

In 242, a thin, flexible, electrically insulating support (121, FIG. 8; or 320, FIG. 16) is positioned on a substrate (110, FIG. 8; 340, FIG. 16), so that a plurality of electrically conductive elements (ECEs 124, FIG. 8; or ECEs 324, FIG. 16) on the support are aligned with respect to a corresponding plurality of lands (112/113, FIG. 8 or 344, FIG. 16) on the substrate.

In 244, an IC (die 100, FIG. 8) is positioned on the support, so that a plurality of lands (102/103, FIG. 8) on the IC are aligned with respect to a corresponding plurality of ECEs (124, FIG. 8) on the support. Alternatively, an IC package (e.g. the IC package that includes die 301 and IC package substrate 310, FIG. 16) is positioned on the support, so that a plurality of lands (312, FIG. 16) on the IC package are aligned with respect to a corresponding plurality of ECEs (324, FIG. 16) on the support.

In 246 (alternative method), a thin, flexible, electrically insulating support (121, FIG. 8) is positioned on an IC (die 100, FIG. 8), so that a plurality of ECEs (124, FIG. 8) on the support are aligned with respect to a corresponding plurality of lands (102/103, FIG. 8) on the IC. Alternatively, the support is positioned on an IC package (e.g. the IC package that includes die 301 and IC package substrate 310, FIG. 16), so that a plurality of ECEs (324, FIG. 16) on the support are aligned with respect to a corresponding plurality of lands (312, FIG. 16) on the IC package.

In 248 (alternative method), the support is positioned on a substrate (110, FIG. 8; or 340, FIG. 16), so that a plurality of lands (112/113, FIG. 8; or 344, FIG. 16) on the substrate are aligned with respect to a corresponding plurality of ECEs (124, FIG. 8; or 324, FIG. 16) on the support.

In 250 (both methods), the IC or IC package, the support, and the substrate are compressed together to maintain electrical contact between the lands on the IC or the IC package and the lands on the substrate. The methods end at 252.

The operations described above with respect to the methods illustrated in FIGS. 18 and 19 can be performed in a different order from those described herein.

The inventive subject matter provides for a socketable electronic package, in several different embodiments, and for methods of marnifacture thereof, that minimize the thickness of the package and that minimize loop inductance within the package. An electronic system and/or data processing system that incorporates one or more electronic assemblies that utilize the inventive subject matter can be produced in configurations having socketable TC's and/or IC packages, with reduced physical dimensions, and with enhanced electronic performance, and such systems are therefore more commercially attractive.

As shown herein, the inventive subject can be implemented in a number of different embodiments, including an electronic package, an electronic assembly, an electronic system, a data processing system, methods for packaging an IC, and methods for mounting an IC package on a substrate. Other embodiments will be readily apparent to those of ordinary skill in the art. The elements, materials, geometries, dimensions, and sequence of operations can all be varied to suit particular packaging requirements.

For example, while an embodiment of an IC is shown in which signal traces are provided around the periphery and in which power supply traces are provided at the die core, the inventive subject matter is equally applicable to embodiments where signal traces and power supply traces are provided anywhere on the die.

Further, embodiments of the inventive subject matter are not to be construed as limited to use in land grid array (LGA) packages, and they can be used with any other type of IC package where the herein-described features of the inventive subject matter provide an advantage.

Various embodiments of compression connectors 120/150/160 can be implemented. The structure, including types of materials used, dimensions, layout, electrical properties, and so forth, of connectors 120/150/160 can be built in a wide variety of embodiments, depending upon the requirements of the IC package and/or electronic assembly of which the connector(s) forms a part.

While a ball grid array (BGA) arrangement 56 is illustrated in FIG. 15 for coupling IC package 105 (FIG. 8) to substrate 140 (FIG. 15), embodiments of the inventive subject matter are not limited to use with a BGA arrangement, and they can be used with any other type of packaging technology, e.g. land grid array (LGA), chip scale package (CSP), or the like.

The above-described choice of materials, geometry, and assembly operations can all be varied by one of ordinary skill in the art to optimize the performance of the electronic package.

Any suitable method, or combination of different methods, for optionally depositing metal coatings on the ECEs can be used, such as sputtering, vapor, electrical, chemical including chemical vapor deposition (CVD), vacuum, and so forth.

The particular implementation of the inventive subject matter is very flexible in terms of the orientation, size, number, and composition of its constituent elements. Various embodiments of the invention can be implemented using various combinations of thin film and ACF technology, particle and wire wad technology, substrate technology, and IHS technology to achieve the advantages of the inventive subject matter.

FIGS. 1 through 17 are merely representational and are not drawn to scale. Certain proportions thereof may be exaggerated, while others may be minimized. FIGS. 1 and 5–19 are intended to illustrate various implementations of the inventive subject matter that can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the inventive subject matter. Therefore, it is manifestly intended that embodiments of this invention be limited only by the claims and the equivalents thereof.

What is claimed is:

1. An electronic package comprising:
    a die;
    a substrate; and
    a compressible connector to couple the die to the substrate, wherein the connector includes
        a flexible support formed of plastic, the support having a relatively uniform thickness, the support further having upper and lower sides, and
        a plurality of electrically conductive relatively non-compressible particles within the flexible support, wherein selected particles have a dimension equal to or exceeding the thickness of the flexible support, wherein the selected particles extend between the upper and lower sides, and wherein the selected particles have an irregular non-cylindrical shape.

2. The electronic package recited in claim 1, wherein the selected ones of the plurality of electrically conductive particles are to couple lands on the die to corresponding lands on the substrate.

3. The electronic package recited in claim 2 and further comprising:
    a compression element to maintain electrical contact between the lands on the die and the lands on the substrate.

4. The electronic package recited in claim 3, wherein the compression element is a lid comprising a member in contact with the die and a support coupled to the substrate.

5. The electronic package recited in claim 1, wherein the particles are formed of material from the group consisting of silicon, glass, quartz, and diamond.

6. The electronic package recited in claim 1, wherein the particles comprise a coating of electrically conductive material.

7. The electronic package recited in claim 1, wherein the particles comprise material from the group consisting of aluminum, antimony, beryllium, bismuth, cadmium, carbon, chromium, copper, gold, indium, iron, lead, magnesium, manganese, molybdenum, nickel, palladium, platinum, silicon, silver, tin, titanium, tungsten, zinc, metal silicide, doped polysilicon, and plastic.

8. An electronic package comprising:
    an integrated circuit (IC) package;
    a substrate; and
    a compressible connector to couple the IC package to the substrate, wherein the connector includes a flexible support formed of plastic, the support having a relatively uniform thickness, the support further having upper and lower sides, and a plurality of electrically conductive, relatively non-compressible particles within the flexible support, wherein selected particles have a dimension equal to or exceeding the thickness of the flexible support, wherein the selected particles extend between the upper and lower sides, and wherein the selected particles have in irregular, non-cylindrical shape.

9. The electronic package recited in claim 8, wherein the selected ones of the plurality of electrically conductive particles are to couple lands on the IC package to corresponding lands on the substrate.

10. The electronic package recited in claim 9 and further comprising;

a compression element to maintain electrical contact between the lands on the IC package and the lands on the substrate.

11. The electronic package recited in claim 10, wherein the compression element is a lid comprising a member in contact with the IC package and a support coupled to the substrate.

12. The electronic package recited in claim 8, wherein the particles are formed of material from the group consisting of silicon, glass, quartz, and diamond.

13. The electronic package recited in claim 8, wherein the particles comprise a coating of electrically conductive material.

14. The electronic package recited in claim 8, wherein the particles comprise material the group consisting of aluminum, antimony, beryllium, bismuth, cadmium, carbon, chromium, copper, gold, indium, iron, lead, magnesium, manganese, molybdenum, nickel, palladium, platinum, silicon, silver, tin, titanium, tungsten, zinc, metal silicide, doped polysilicon, and plastic.

15. An electronic system comprising at least one electronic assembly comprising:

an integrated circuit (IC) package;

a substrate; and a compressible connector to couple the IC package to the substrate, wherein the connector includes a flexible support formed of plastic, the support having a relatively uniform thickness, the support further having upper and lower sides, and a plurality of electrically conductive, relatively non-compressible particles within the flexible support, wherein selected particles have a dimension equal to or exceeding the thickness of the flexible support, wherein the selected particles extend between the upper and lower sides, and wherein the selected particles have an irregular, non-cylindrical shape.

16. The electronic system recited in claim 15, wherein the selected ones of the plurality of electrically conductive particles are to couple lands on the IC package to corresponding lands on the substrate.

17. The electronic system recited in claim 16, wherein the at least one electronic assembly further comprises a compression element to maintain electrical contact between the lands on the IC package and the lands on the substrate.

18. A data processing system comprising:

a bus coupling components in the data processing system;

a display coupled to the bus;

external memory coupled to the bus; and a processor coupled to the bus and including at least one electronic assembly that includes:

an integrated circuit (IC) package;

a substrate; and a compressible connector to couple the IC package to the substrate, wherein the connector includes a flexible support formed of plastic, the support having a relatively uniform thickness, the support further having upper and lower sides, and a plurality of electrically conductive, relatively non-compressible particles within the flexible support, wherein selected particles have a dimension equal to or exceeding the thickness of the flexible support, wherein the selected particles extend between the upper and lower sides, and wherein the selected particles have an irregular, non-cylindrical shape.

19. The data processing system recited in claim 18, wherein the selected ones of the plurality of electrically conductive particles are to couple lands on the IC package to corresponding lands on the substrate.

20. The data processing system recited in claim 19, wherein the at least one electronic assembly further comprises a compression element to maintain electrical contact between the lands on the IC package and the lands on the substrate.

21. An electronic package comprising:

a die;

a substrate; and a compressible connector to couple the die to the substrate, wherein the connector includes a flexible insulating support having a relatively uniform thickness, the support further having upper and lower sides, and a plurality of electrically conductive, relatively non-compressible particles within the flexible support, wherein selected particles have a dimension equal to or exceeding the thickness of the flexible support, wherein the selected particles extend between the upper and lower sides, and wherein the selected particles have an irregular, non-cylindrical shape.

22. The electronic package recited in claim 21, wherein the selected ones of the plurality of particles are to couple lands on the die to corresponding lands on the substrate.

23. The electronic package recited in claim 22 and further comprising a compression element to maintain electrical contact between the lands on the die and the lands on the substrate.

24. The electronic package recited in claim 23, wherein the compression element is a lid comprising a member in contact with the die and a support coupled to the substrate.

25. The electronic package recited in claim 21, wherein the particles are formed of material from the group consisting of silicon, glass, quartz, and diamond.

26. The electronic package recited in claim 21, wherein the insulating support is formed of material from the group consisting of a plastic, a resin, and a polymer.

27. An electronic package comprising:

an integrated circuit (IC) package;

a substrate; and a compressible connector to couple the IC package to the substrate, wherein the connector includes a flexible insulating support having a relatively uniform thickness, the support further having upper and lower sides, and a plurality of electrically conductive, relatively non-compressible particles within the flexible support wherein selected particles have a dimension equal to or exceeding the thickness of the flexible support, wherein the selected particles extend between the upper and lower sides, and wherein the selected particles have an irregular, non-cylindrical shape.

28. The electronic package recited in claim 27, wherein the selected ones of the plurality of particles are to couple lands on the IC package to corresponding lands on the substrate.

29. The electronic package recited in claim 28, and further comprising a compression element to maintain electrical contact between the lands on the IC package and the lands on the substrate.

30. The electronic package recited in claim 28, wherein the insulating support is formed of material from the group consisting of plastic, a resin, and a polymer.

31. An electronic system comprising at least one electronic assembly comprising:

an integrated circuit (IC) package;

a substrate; and a compressible connector to couple the IC package to the substrate, wherein the connector includes a flexible insulating support having a relatively uniform thickness, the support further having upper and lower sides, and a plurality of electrically conductive, relatively non-compressible particles within the flexible support, wherein selected particles have a dimension equal to or exceeding the thickness of the flexible support, wherein the selected particles extend between the upper and lower sides, and wherein the selected particles have an irregular, non-cylindrical shape.

32. The electronic system recited in claim 31, wherein the selected ones of the plurality of particles are to couple lands on the IC package to corresponding lands on the substrate.

33. The electronic package recited in claim 32, and further comprising a compression element to maintain electrical contact between the lands on the IC package and the lands on the substrate.

34. The electronic package recited in claim 31, wherein the insulating support is formed of material from the group consisting of a plastic, a resin, and a polymer.

* * * * *

UNITED STATES PATENT AND TRADEMARK OFFICE
CERTIFICATE OF CORRECTION

PATENT NO. : 6,840,777 B2
DATED : January 11, 2005
INVENTOR(S) : Sathe et al.

It is certified that error appears in the above-identified patent and that said Letters Patent is hereby corrected as shown below:

Column 14,
Line 31, after "conductive" insert -- , --.
Line 37, after "irregular" insert -- , --.

Column 15,
Line 10, delete "in" and insert -- an --, therefor.
Line 17, after "comprising" delete ";" and insert -- : --.
Line 32, after "material" insert -- from --.

Column 16,
Line 67, after "support" insert -- , --.

Column 17,
Line 14, delete "claim 28" and insert -- claim 27 --, therefor.

Signed and Sealed this

Twenty-third Day of August, 2005

JON W. DUDAS
*Director of the United States Patent and Trademark Office*